(12) United States Patent
Eberlein et al.

(10) Patent No.: US 8,362,777 B2
(45) Date of Patent: Jan. 29, 2013

(54) OPTIMIZED FLAT/SADDLE COIL COOLING SYSTEM

(75) Inventors: Eva Eberlein, Baiersdorf (DE); Ralph Kimmlingen, Zirndorf (DE)

(73) Assignee: Siemens Aktiengesellschaft, Munich (DE)

( * ) Notice: Subject to any disclaimer, the term of this patent is extended or adjusted under 35 U.S.C. 154(b) by 423 days.

(21) Appl. No.: 12/795,798

(22) Filed: Jun. 8, 2010

(65) Prior Publication Data

US 2010/0308831 A1    Dec. 9, 2010

(30) Foreign Application Priority Data

Jun. 8, 2009  (DE) .......................... 10 2009 024 226

(51) Int. Cl.
*G01V 3/00*  (2006.01)
(52) U.S. Cl. ...................................................... 324/318
(58) Field of Classification Search .......... 324/300–322; 600/410–435
See application file for complete search history.

(56) References Cited

U.S. PATENT DOCUMENTS

| | | | |
|---|---|---|---|
| 5,489,848 A * | 2/1996 | Furukawa ..................... | 324/318 |
| 6,111,412 A | 8/2000 | Boemmel et al. | |
| 6,236,207 B1 * | 5/2001 | Arz et al. ....................... | 324/318 |
| 6,448,774 B1 | 9/2002 | Heid | |
| 6,552,545 B2 * | 4/2003 | Kaindl et al. ................. | 324/318 |
| 6,642,717 B2 * | 11/2003 | Dietz et al. .................... | 324/318 |
| 6,653,835 B2 * | 11/2003 | Roeckelein et al. .......... | 324/315 |
| 6,819,107 B2 * | 11/2004 | Heid ............................. | 324/318 |
| 6,943,551 B2 | 9/2005 | Eberler et al. | |
| 6,977,501 B2 * | 12/2005 | Kassai et al. ................. | 324/315 |
| 7,015,692 B2 * | 3/2006 | Clarke et al. .................. | 324/300 |
| 7,339,376 B2 * | 3/2008 | Liu ................................ | 324/318 |
| 7,489,131 B2 * | 2/2009 | Lvovsky ....................... | 324/307 |
| 7,528,604 B2 * | 5/2009 | Gromoll et al. ............... | 324/318 |
| 7,570,058 B1 * | 8/2009 | Wong et al. ................... | 324/318 |
| 7,741,847 B2 * | 6/2010 | Nakabayashi et al. ........ | 324/320 |
| 7,782,167 B2 * | 8/2010 | Kolbeck et al. ............... | 336/207 |
| 7,812,604 B2 * | 10/2010 | Icoz et al. ..................... | 324/315 |
| 8,018,232 B2 * | 9/2011 | Hollis ........................... | 324/318 |

* cited by examiner

*Primary Examiner* — Dixomara Vargas
(74) *Attorney, Agent, or Firm* — Schiff Hardin LLP

(57) ABSTRACT

An optimization of a magnetic resonance apparatus is achieved by a device and a method to generate a gradient field in a magnetic resonance apparatus, wherein a field directed in a first direction is generated by a first flat/saddle coil cooling system, a field directed in an additional direction is generated by an additional flat/saddle coil cooling system, and wherein a gradient field pointing in a direction is composed of at least the field generated by the first flat/saddle coil cooling system and the field generated by the additional flat/saddle coil cooling system.

24 Claims, 5 Drawing Sheets

OPTIMIZED FLAT/SADDLE COIL COOLING SYSTEM

BACKGROUND OF THE INVENTION

1. Field of the Invention

The present invention concerns a magnetic resonance apparatus and method to generate a gradient field in a magnetic resonance apparatus.

2. Description of the Prior Art

Magnetic resonance apparatuses, in particular to examine patients by magnetic resonance tomography, are known from DE 103 14 215 B4, for example.

Modern magnetic resonance systems operate with coils that emit radio-frequency pulses for nuclear magnetic resonance excitation and/or to receive induced magnetic resonance signals. A magnetic resonance system typically has a larger coil that is normally permanently installed in the apparatus (what is known as a whole-body coil, also called a body coil or BC) and multiple small local coils (also called surface coils or LCs).

To obtain information (data) from which images can be generated, selected regions of the subject or, respectively, patient to be examined can be read out with gradient coils for three axes (for example X, Y, approximately radial to the patient, Z in the longitudinal direction of the patient).

The spatial coding in magnetic resonance tomography is typically achieved with the use of a gradient coil system with three independently controllable, magnetically orthogonal gradient field coil systems.

The orientation of the coding plane ("gradient field") can be freely selected by superimposing the three freely scalable fields (in three directions X, Y, Z). In some important MR applications—for example EPI (echoplanar imaging)—this degree of freedom is utilized only to a limited degree. Here the horizontal axis (X-axis) is always used for the readout gradient, which is also designated as a clinically established standard or "gold standard". In EPI the primary load of the gradient sequence (>90% of the sum power of all axes) lies on this horizontal axis (X-axis). In modern gradient systems, the coordinate axes of the three field coils are oriented parallel to the patient coordinate system. Given an axially parallel, asymmetrical gradient load, this leads to a power limitation due to the hardware needed for a single axis. The EPI readout amplitudes are typically limited by the available cooling power for the gradient field coils of the X-axis of the gradient system.

This problem has previously been addressed by dimensioning the system limit according to the limit, for a single axis, and corresponding limitation of the sequence parameters.

SUMMARY OF THE INVENTION

An object of the present invention is an optimization of the thermal properties of an arrangement composed of flat and/or saddle cooling coils, in particular with regard to heat generation and dissipation.

The arrangement of a flat/saddle coil cooling system to shift the power limit from the thermal boundary of the gradient coil to the (higher) mains power boundary of the gradient amplifier can have the following advantages:

the applicable power can be increased by up to 40%, for example in EPI,
the available readout gradient strength can be increased by up to 18%, for example in EPI,
the available slew rate can be increased by up to 40%, for example in EPI,
the available maximum gradient strength can be increased by up to 40%, for example in EPI,
the realization in the MR controller can be implemented simply.

A magnetic resonance apparatus according to the invention has a first flat/saddle coil cooling system to generate a field directed in a first direction, an additional flat/saddle coil cooling system to generate a field directed in an additional direction, wherein the gradient field in a direction (approximately radial in the patient or MRT) is composed of at least the field generated by the first flat/saddle coil cooling system and the field generated by the additional flat/saddle coil cooling system.

The term "flat saddle" coding system means a cooling system for a flat coil or a saddle coil, and this encompasses a cooling system for a saddle coil that is a flat coil.

The invention also encompasses a method to generate a gradient field in a magnetic resonance apparatus, wherein a field directed in a first direction is generated by a first flat/saddle coil cooling system, a field directed in an additional direction is generated by an additional flat/saddle coil cooling system, and wherein a gradient field pointing in a direction is composed of at least the field generated by the first flat/saddle coil cooling system and the field generated by the additional flat/saddle coil cooling system.

The direction of the gradient field is advantageously directed approximately horizontally, which produces the acquisition properties (with regard to artifacts etc.) largely identical to those in conventional apparatuses (with horizontal field of a single activated flat/saddle cooling coil system) and therefore delivers those image(s) that the magnetic resonance apparatus uses that are essentially to be interpreted in the same manner as in conventional apparatuses.

According to one embodiment of the invention, an angle between 0 degrees and 45 degrees between the direction of a magnetic field generated by a first flat/saddle coil cooling system and the horizontal is provided, in particular an angle of approximately 45 degrees which can generate a maximum field from the two gradient coil arrangements.

According to one embodiment of the invention, the gradient coils are operated in a magnetic resonance apparatus in which more than half—in particular more than 80% (advantageously more than 90%)—of the power applied to the gradient coils is used for a gradient field in one direction (for example X) because here the power advantages show up particularly clearly.

DESCRIPTION OF THE PREFERRED EMBODIMENTS

Figure 1:
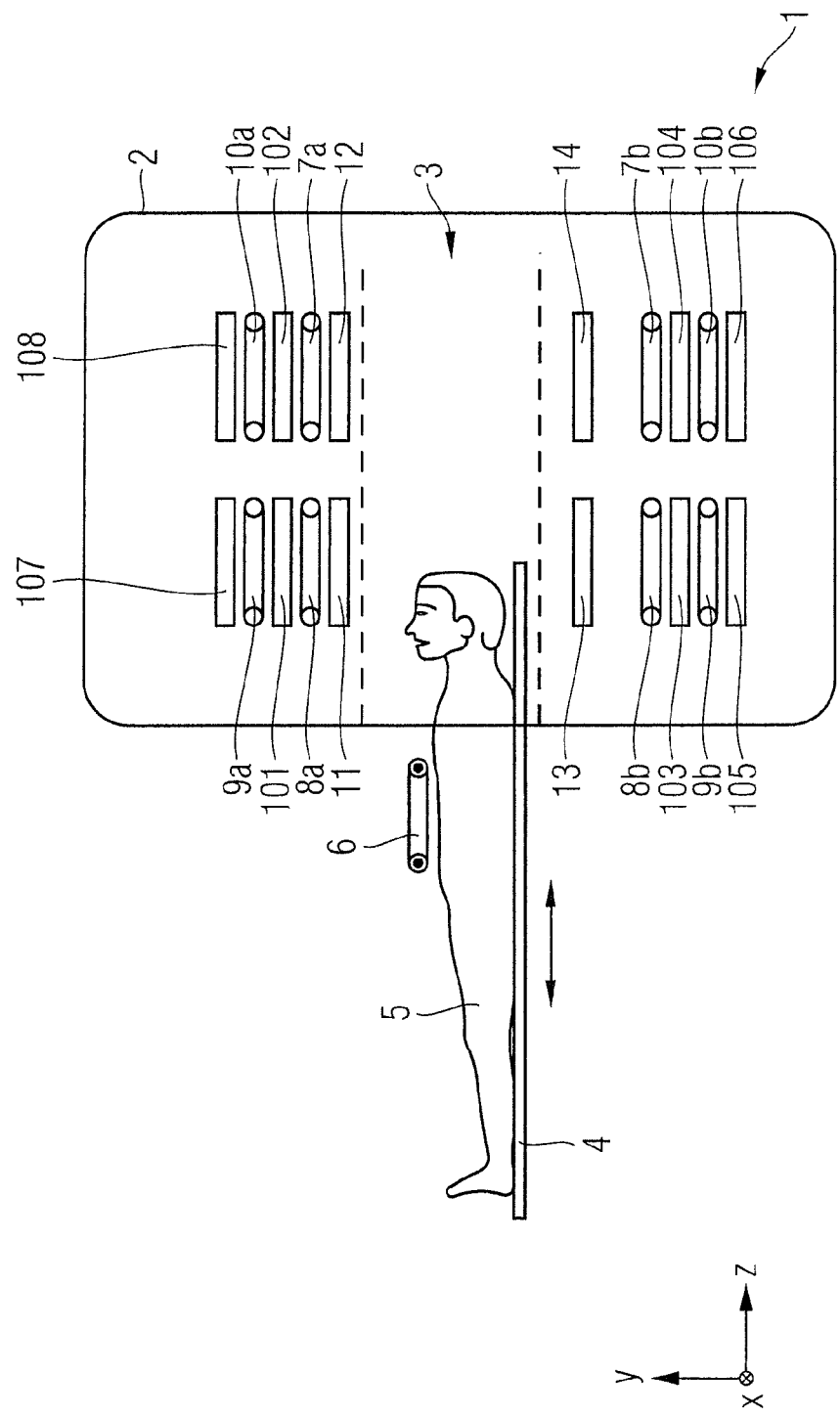
FIG. 1 schematically illustrates a magnetic resonance apparatus.

FIG. 1 shows a magnetic resonance apparatus 1 with a whole-body coil 2 and a tube-shaped space 3 into which a patient bed 4 (for example with a patient 5 and a local coil 6) can be driven in order to generate exposures of the patient 5.

In the whole-body coil 2, flat/saddle coil cooling systems are provided that respectively comprise pairs (two here) of saddle coils. Cooling planes 101, 102, 103, 104, 105, 106, 107, 108 are also called cooling layers in the following. Shown here are exemplary pairs of saddle coils 7a, 7b and 8a, 8b for the generation of a Y-gradient field in the Y-direction and pairs of saddle coil gradient coils 9a, 9b; 10a, 10b for generation of an X-gradient field in the X-direction. These saddle coils, together with the cooling layers XX and YY, form a unit. The cooling layers are fashioned such that the regions of maximum cooling capacity coincide with the regions of maximum current density (thermal hotspots) of both gradient axes X and Y.

Different embodiments can provide the following:
  i) Layer structure X_Y_cooling or layer structure X_cooling_Y or layer structure cooling_X_Y: the cooling plane contains four regions of increased cooling efficiency (for example increased winding density of hoses) which coincide with the thermal hotspots of X- and Y-axis
  ii) Layer structure X_cooling_Y_cooling: each of the two cooling layers contains two regions of increased cooling efficiency matching the respective gradient axis to be cooled.

Additional known coils for generation of a basic magnetic field and coils to generate a z-gradient field and other known elements are also provided that are not shown here to improve the clarity.

Figure 2:
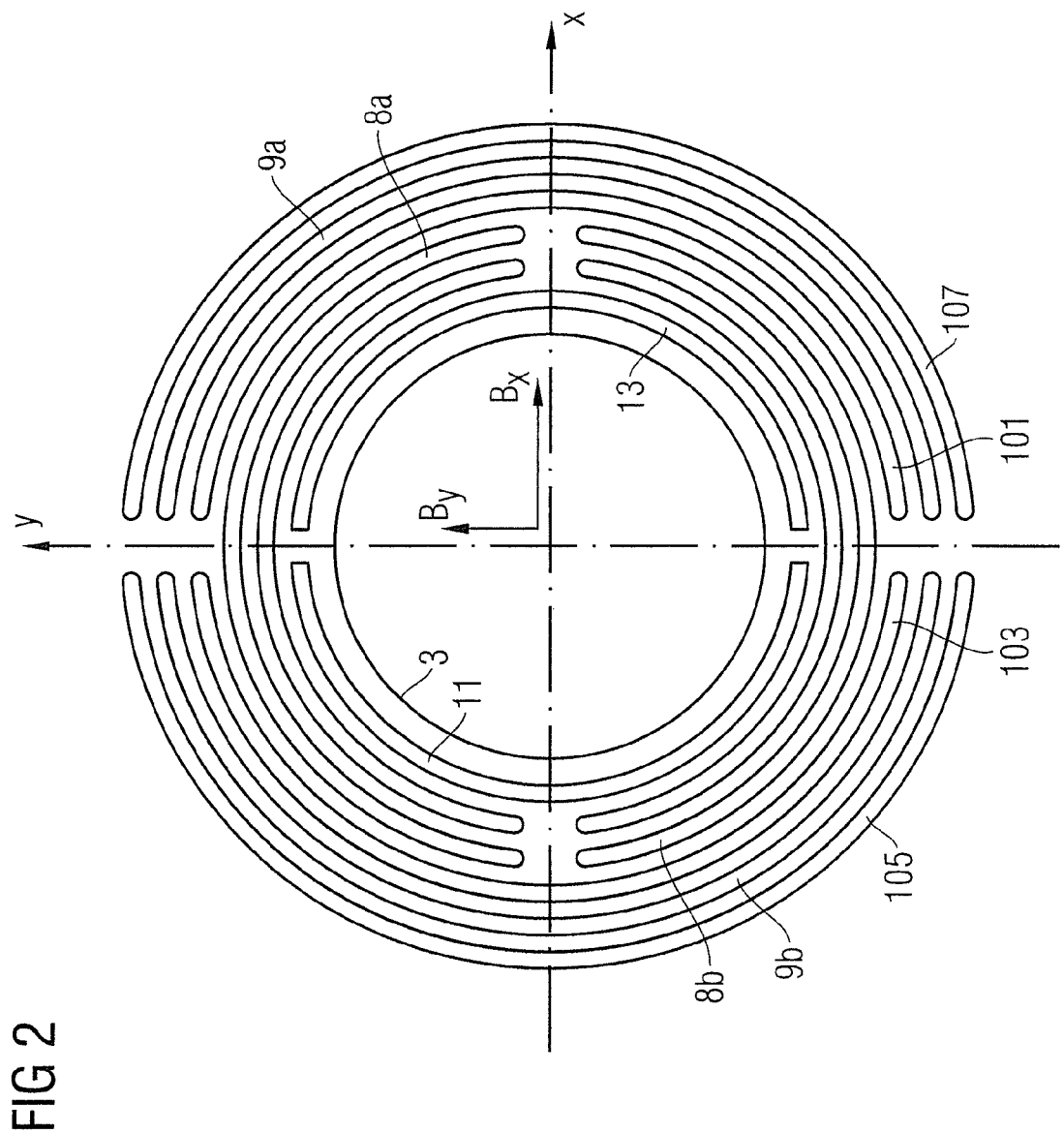
FIG. 2 shows in cross section, gradient coils for the (horizontal) X-axis and the (vertical) Y-axis.

As a cross section through a magnetic resonance apparatus 1 according to the prior art, FIG. 2 shows gradient coils 8a, 8b to generate a Y-gradient field in the Y-direction and gradient coils 9a, 9b to generate an X-gradient field in the X-direction. The field of the gradient coils 8a, 8b is aligned in the Y-direction and the field of the gradient coils 9a, 9b is thereby aligned in the X-direction.

Figure 3:
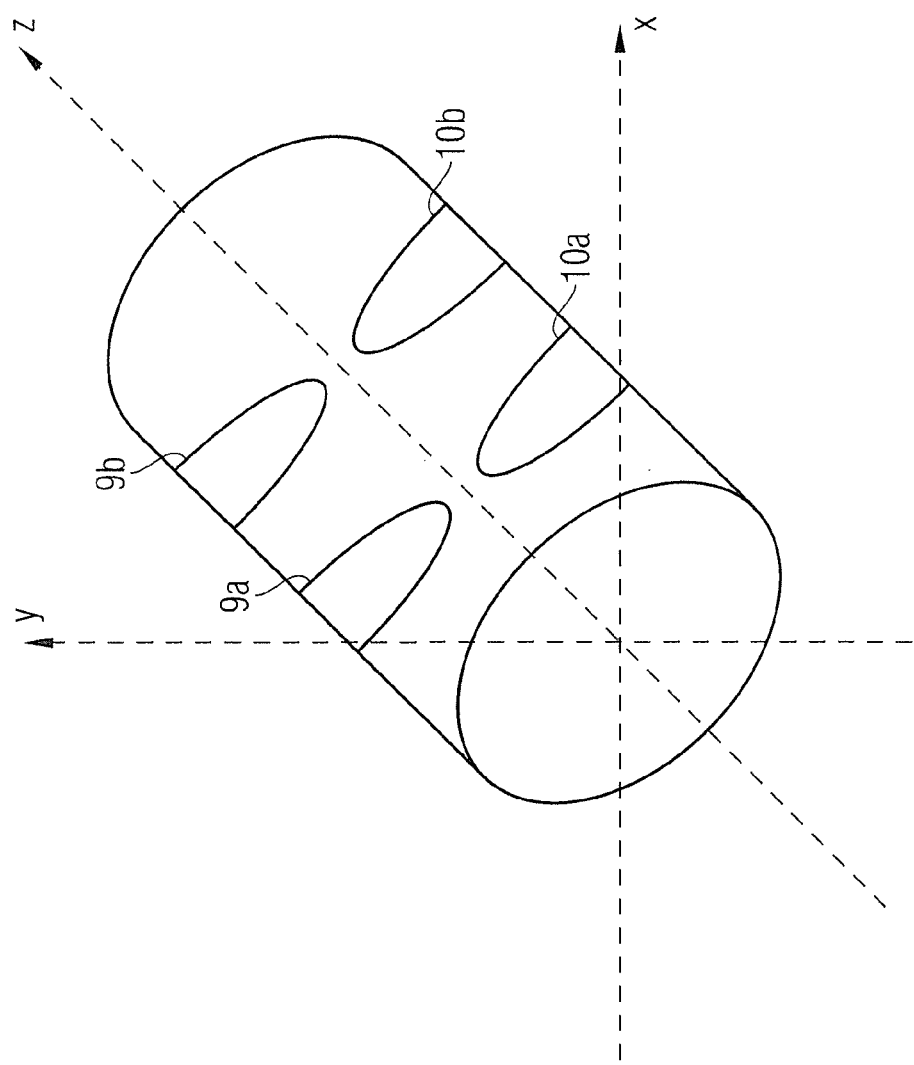
FIG. 3 shows spatial gradient coils for the (horizontal) X-axis.

FIG. 3 shows as a spatial view a winding layer of a magnetic resonance apparatus 1 on which the gradient coils 9a, 9b; 10a, 10b are wound.

Figure 4:
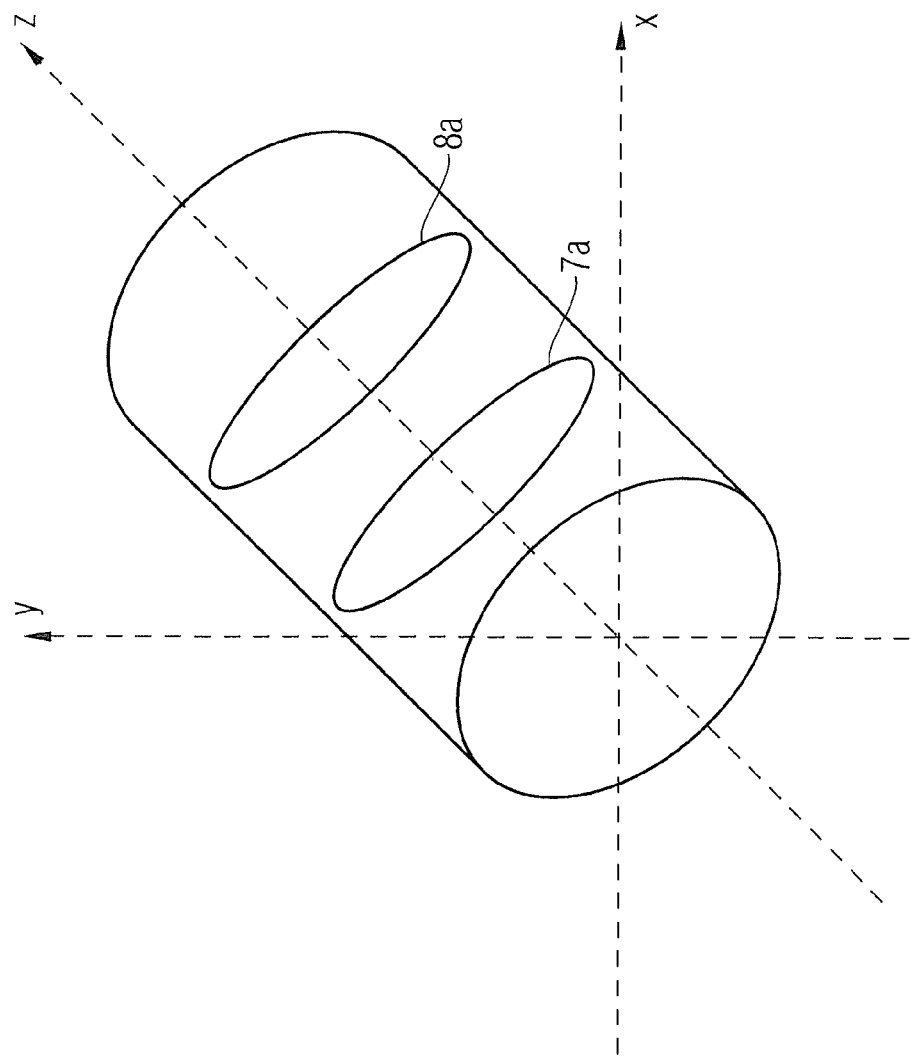
FIG. 4 shows spatial gradient coils for the (vertical) Y-axis.

FIG. 4 shows as a spatial view a winding layer of a magnetic resonance apparatus 1 on which the gradient coils 7a, 7b, 8a, 8b are wound, wherein the gradient coils 7a, 8a are visible.

As shown in FIG. 2, in the shown example the gradient coils 9a, 9b; 10a, 10b are wound in one layer above the gradient coils 7a, 7b, 8a, 8b.

Figure 5:
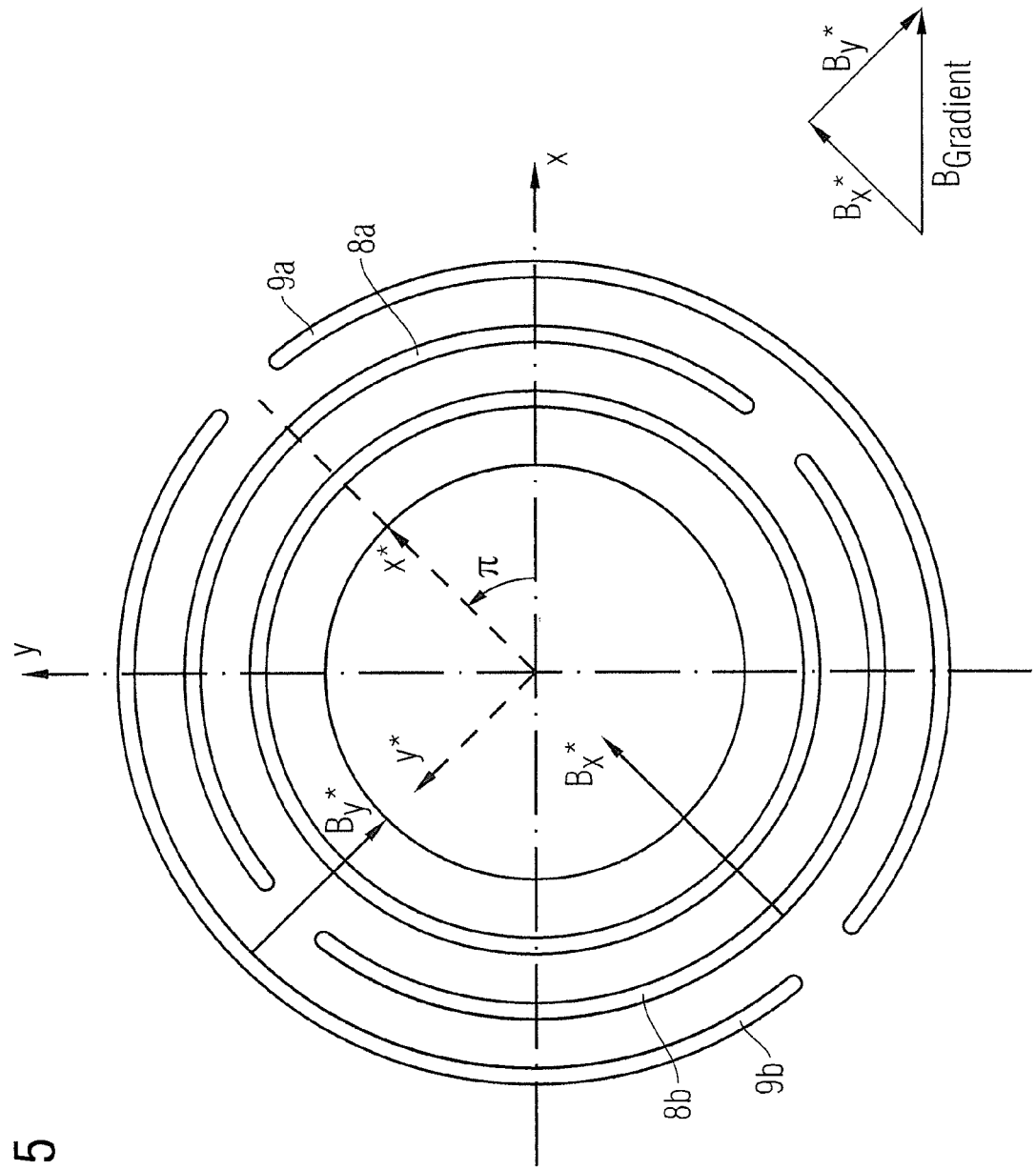
FIG. 5 shows in cross section, gradient coils arranged rotated radially by an angle θ relative to the horizontal.

FIG. 5 shows a magnetic resonance apparatus 1 according to the invention in which the magnetic fields of the gradient coils 7a, 7b, 8a, 8b (gradient coils 8a, 8b are shown)—and therefore also the gradient coil center point verticals—are aligned at an angle θ angled by 0 to 45 degrees relative to the horizontal, advantageously by approximately 45 degrees (wherein the magnetic fields of the gradient coils 9a, 9b; 10a, 10b—gradient coils 9a, 9b are shown—are accordingly aligned at an angle θ relative to the horizontal, which is between 45° and 90°.

With this arrangement those skilled in the art can prevent image effects (for example artifacts) from altering an image representation of the patient (which image representation is acquired with the magnetic resonance apparatus) more than is typical due to the gradient coils 7a, 7b, 8a, 8b, 9a, 9b, 10a, 10b arranged rotated—according to an embodiment of the invention in FIG. 5—by the angle θ around the longitudinal patient axis (thus relative to the horizontal) relative to the prior art (FIG. 2), such that the image would not be immediately comprehensible in the customary manner for an operating physician.

As in FIG. 1 and FIG. 2, in the arrangement according to FIG. 5 cooling planes (=cooling layers) 101, 102, 103, 104, 105, 106, 107, 108 are provided that, for example, can likewise be located in a position rotated by an angle θ relative to FIG. 2; however, for optimization of clarity they are not shown in FIG. 5.

Here it is provided that—in addition to a first flat/saddle coil cooling system 7a, 7b, 8a, 8b (8a, 8b are shown in FIG. 5) to generate a field $B_X$ directed in a first direction X*—an additional flat/saddle coil cooling system 9a, 9b; 10a, 10b (9a, 9b are shown in FIG. 5) is used (simultaneously and/or intermittently for equal durations) to generate a field $B_Y$ directed in a first direction Y* in order to generate a total gradient field $B_{Gradient}$ in the horizontal X-direction. These two flat/saddle coil cooling systems are both connected to current to generate a gradient field $B_{Gradient}$ in one direction such that, in the space 3 of the MRT 1 (thus at least a few points in the patient during the examination) at a point in time, the gradient field $B_{Gradient}=B_{X*}+B_{Y*}$ is composed of the field $B_{X*}$ generated by the first flat/saddle coil cooling system 7a, 7b, 8a, 8b and the field $B_{Y*}$ generated by the additional flat/saddle coil cooling system 9a, 9b; 10a, 10b. The X*-gradient coil arrangement and the Y*-gradient coil arrangement therefore together generate the field in the X-direction (for example notably the strongest field in EPI).

Therefore, given maximum current in each of the gradient coil arrangements (7a, 7b, 8a, 8b/9a, 9b; 10a, 10b) the total field $B_{Gradient}$ in the horizontal X-direction is stronger than if only one gradient coil arrangement at maximum current would be used. In this case the required electrical power and cooling capacity increase by up to a factor of two.

In asymmetrical load operation (for example EPI), approximately only half of the available mains power is utilized by a conventional readout gradient in the X-direction. This is conditional upon the thermal limit of the X-gradient axis. This is achieved as soon as the hotspot temperature exceeds a material-specific limit value (for example 80° C.). According to the invention, the thermal load is distributed on two gradient axes, such that the number of hotspots doubles. According to the invention, the optimal heat dissipation is ensured in a flat/saddle coil cooling system. The thermal limit of the common gradient axis X'=X+Y is thereby shifted upward.

The capacity of the gradient system in asymmetrical load operation could be improved, possibly by up to 40%, via such embodiments of the invention. An arrangement of the field coils according to the invention introduces an angle θ between the patient coordinate system (PKS with axes X and Y, among other things) and the field coil coordinate system (FKS with axes X* and Y*, among other things). The value of θ can be dependent on the structural design of the cooling layer(s) and lies at 0<θ<45". In a preferred case (θ=45") the asymmetrical load can be distributed symmetrically on two field axes.

The thermal load capacity of the gradient system thereby increases significantly, for example for EPI (=MRT technique variant echoplanar imaging).

According to the invention, this is achieved in that the cooling plane possesses regions of maximum cooling efficiency where what are known as the "hotspots" of the transversal coils are situated. If θ=45", the maximum cooling capacity can therefore be called upon for a gradient pulse train in the X-direction of the PKS. The boundary thereby shifts from the cooling capacity of the GC (=gradient coils) toward the power requirement at the mains. In modern systems a factor 150/90=1.66 lies between the "old" and "new" limit, which allows a particularly good utilization of the advantage to realistically appear at θ=45".

Additional advantages result in the operation of the gradient amplifier: according to this embodiment of the invention, because long-running EPI sequences no longer maximally load the end (output) stage of the amplifier; rather, two end stages are loaded with half of the maximum load. As an advantageous side effect, the slew rate on the X-axis of the PKS increases by up to a factor of the square root of two at θ=45". Since in EPI sequences the available slew rate is 5-10% lower than in standard sequences due to the asymmetrical amplifier load, here an immediate advantage results for the image quality. The same accordingly applies for the maximum gradient strength on the X-axis of the PKS, which can be used for a cost-effective hardware design, for example.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a magnetic resonance data acquisition unit configured to operate to acquire magnetic resonance data from an examination subject therein;
   a first flat/saddle coil cooling system that generates a magnetic field in a first direction, said first flat/saddle coil cooling system comprising coils selected from the group consisting of flat coils and saddle coils;
   an additional flat/saddle coil cooling system that generates a magnetic field in an additional direction, said additional flat/saddle coil cooling system comprising coils selected from the group consisting of flat coils and saddle coils; and
   said first flat/saddle coil cooling system and said additional flat/saddle coil cooling system being configured to generate a gradient magnetic field in a direction composed of at least said magnetic field generated by the first flat/saddle coil cooling system and the additional field generated by the additional flat/saddle coil cooling system.

2. A magnetic resonance apparatus as claimed in claim 1 wherein said first flat/saddle coil cooling system and said additional flat/saddle coil cooling system each has a cooling plane, and wherein the respective cooling planes have regions of maximum cooling capacity substantially coinciding with a region of maximum current density in said first flat/saddle coil cooling system and said additional flat/saddle coil cooling system.

3. A magnetic resonance apparatus as claimed in claim 1 wherein said first flat/saddle coil cooling system generates said magnetic field in a direction at an angle in a range between 0° and 45° relative to the horizontal.

4. A magnetic resonance apparatus as claimed in claim 1 wherein said first flat/saddle coil cooling system generates said magnetic field in a direction at an angle in a range between 40° and 45° relative to the horizontal.

5. A magnetic resonance apparatus as claimed in claim 1 wherein said first flat/saddle coil cooling system generates said magnetic field in a direction toward the examination subject, and said additional flat/saddle coil cooling system generates said additional magnetic field in a direction toward the examination subject.

6. A magnetic resonance apparatus as claimed in claim 1 wherein said first flat/saddle coil cooling system and said additional flat/saddle coil cooling system are configured to generate said gradient magnetic field horizontally.

7. A magnetic resonance apparatus as claimed in claim 1 wherein said first flat/saddle coil cooling system and said additional flat/saddle coil cooling system are configured to generate said gradient magnetic field in a direction toward the examination subject.

8. A magnetic resonance apparatus as claimed in claim 1 wherein each of said first flat/saddle coil cooling system and said additional flat/saddle coil cooling system each comprise two pairs of gradient coils.

9. A magnetic resonance apparatus as claimed in claim 8 wherein said magnetic resonance data acquisition unit comprises a radio-frequency coil, and wherein each of said first flat/saddle coil cooling system and said additional flat/saddle coil cooling system comprises gradient coils on opposite sides of said radio-frequency coil.

10. A magnetic resonance apparatus as claimed in claim 1 wherein said first saddle coil cooling system generates said magnetic field orthogonally to said magnetic field generated by said additional flat/saddle coil cooling system.

11. A magnetic resonance apparatus as claimed in claim 1 wherein said magnetic resonance data acquisition unit comprises a radio-frequency system comprising at least one radio-frequency coil selected from the group consisting of a whole-body coil and a local coil.

12. A magnetic resonance apparatus as claimed in claim 1 wherein said magnetic resonance data acquisition unit is configured to operate according to a Cartesian coordinate system, and wherein said first flat/saddle coil cooling system generates said magnetic field in the x-direction of said Cartesian coordinate system and wherein said additional flat/saddle coil cooling arrangement generates said additional magnetic field in the y-direction of said Cartesian coordinate system.

13. A method for operating a magnetic resonance system comprising the steps of:
   operating a magnetic resonance data acquisition unit to acquire magnetic resonance data from an examination subject therein;
   during operation of said magnetic resonance data acquisition unit, generating a magnetic field in a first direction in said magnetic resonance data acquisition unit with a first flat/saddle coil cooling system, said first flat/saddle coil cooling system comprising coils selected from the group consisting of flat coils and saddle coils;
   during operation of said magnetic resonance data acquisition unit, generating a magnetic field in an additional direction in said magnetic resonance data acquisition unit with an additional flat/saddle coil cooling system, said additional flat/saddle coil cooling system comprising coils selected from the group consisting of flat coils and saddle coils; and
   operating said first flat/saddle coil cooling system and said additional flat/saddle coil cooling system to generate a gradient magnetic field in a direction composed of at least said magnetic field generated by the first flat/saddle coil cooling system and the additional field generated by the additional flat/saddle coil cooling system.

14. A method as claimed in claim 13 wherein said first flat/saddle coil cooling system and said additional flat/saddle coil cooling system each has a cooling plane, and configuring said first flat/saddle coil cooling system and said additional first flat/saddle coil cooling system to cause respective regions of maximum cooling capacity of the respective cooling planes to substantially coincide with a region of maximum current density in said first flat/saddle coil cooling system and said additional flat/saddle coil cooling system.

15. A method as claimed in claim 13 comprising generating said magnetic field, with said first flat/saddle coil cooling system, in a direction at an angle in a range between 0° and 45° relative to the horizontal.

16. A method as claimed in claim 13 comprising generating said magnetic field, with said first flat/saddle coil cooling system in a direction at an angle in a range between 40° and 45° relative to the horizontal.

17. A method as claimed in claim 13 comprising generating said magnetic field, with said first flat/saddle coil cooling system in a direction toward the examination subject, and generating said additional magnetic field, with said additional flat/saddle coil cooling system, in a direction toward the examination subject.

18. A method as claimed in claim 13 comprising configuring said first flat/saddle coil cooling system and said additional flat/saddle coil cooling system to generate said gradient magnetic field horizontally.

19. A method as claimed in claim 13 comprising configuring said first flat/saddle coil cooling system and said additional flat/saddle coil cooling system to generate said gradient magnetic field in a direction toward the examination subject.

20. A method as claimed in claim 13 comprising configuring each of said first flat/saddle coil cooling system and said additional flat/saddle coil cooling system two pairs of gradient coils.

21. A method as claimed in claim 20 wherein said magnetic resonance data acquisition unit comprises a radio-frequency coil, and comprising configuring each of said first flat/saddle coil cooling system and said additional flat/saddle coil cooling system with gradient coils on opposite sides of said radio-frequency coil.

22. A method as claimed in claim 13 comprising generating said magnetic field, with said first saddle coil cooling system, orthogonally to said magnetic field generated by said additional flat/saddle coil cooling system.

23. A method as claimed in claim 13 comprising operating said magnetic resonance data acquisition unit with a radio-frequency system comprising at least one radio-frequency coil selected from the group consisting of a whole-body coil and a local coil.

24. A method as claimed in claim 13 wherein said magnetic resonance data acquisition unit is configured to operate according to a Cartesian coordinate system, and comprising generating said magnetic field, with said first flat/saddle coil cooling system in the x-direction of said Cartesian coordinate system and generating said additional magnetic field, with said additional flat/saddle coil cooling system, in the y-direction of said Cartesian coordinate system.

* * * * *